(12) United States Patent
Chuang et al.

(10) Patent No.: US 10,877,089 B2
(45) Date of Patent: Dec. 29, 2020

(54) SEMICONDUCTOR WAFER TESTING SYSTEM AND RELATED METHOD FOR IMPROVING EXTERNAL MAGNETIC FIELD WAFER TESTING

(71) Applicant: Taiwan Semiconductor Manufacturing Co., Ltd., Hsin-Chu (TW)

(72) Inventors: Harry-Hak-Lay Chuang, Zhubei (TW); Chih-Yang Chang, Hsinchu (TW); Ching-Huang Wang, Pingjhen (TW); Tien-Wei Chiang, Taipei (TW); Meng-Chun Shih, Hsinchu (TW); Chia Yu Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/411,647

(22) Filed: May 14, 2019

(65) Prior Publication Data

US 2020/0096559 A1 Mar. 26, 2020

Related U.S. Application Data

(60) Provisional application No. 62/735,271, filed on Sep. 24, 2018.

(51) Int. Cl.
*G01R 31/02* (2006.01)
*G01R 31/28* (2006.01)
(Continued)

(52) U.S. Cl.
CPC ............ *G01R 31/2865* (2013.01); *G01R 1/16* (2013.01); *G01R 31/2887* (2013.01);
(Continued)

(58) Field of Classification Search
CPC ............ G01R 31/2865; G01R 31/2886; G01R 31/2887; G01R 31/2889; G01R 31/2891
See application file for complete search history.

(56) References Cited

U.S. PATENT DOCUMENTS

| 5,656,942 A * | 8/1997 | Watts ................. G01R 1/06705 324/750.19 |
| 10,364,147 B2 * | 7/2019 | Rossi ................. G01R 31/2889 |

(Continued)

OTHER PUBLICATIONS

Tokyo Electron, Inc. "Test system Precio Series." The date of publication is unknown. Retrieved online on Jun. 27, 2018 from https://www.tel.com/product/precio.html#product5397.

(Continued)

*Primary Examiner* — Thang X Le
(74) *Attorney, Agent, or Firm* — Eschweiler & Potashnik, LLC

(57) ABSTRACT

In some embodiments, a semiconductor wafer testing system is provided. The semiconductor wafer testing system includes a semiconductor wafer prober having one or more conductive probes, where the semiconductor wafer prober is configured to position the one or more conductive probes on an integrated chip (IC) that is disposed on a semiconductor wafer. The semiconductor wafer testing system also includes a ferromagnetic wafer chuck, where the ferromagnetic wafer chuck is configured to hold the semiconductor wafer while the wafer prober positions the one or more conductive probes on the IC. An upper magnet is disposed over the ferromagnetic wafer chuck, where the upper magnet is configured to generate an external magnetic field between the upper magnet and the ferromagnetic wafer chuck, and where the ferromagnetic wafer chuck amplifies the external magnetic field such that the external magnetic field passes through the IC with an amplified magnetic field strength.

20 Claims, 3 Drawing Sheets

(51) Int. Cl.
    *G11C 11/16*     (2006.01)
    *G01R 1/16*     (2006.01)
    *G11C 29/56*     (2006.01)

(52) U.S. Cl.
    CPC ...... *G01R 31/2891* (2013.01); *G11C 11/1673* (2013.01); *G11C 11/1675* (2013.01); *G11C 29/56016* (2013.01); *G11C 2029/5602* (2013.01)

(56) References Cited

U.S. PATENT DOCUMENTS

| | | | | |
|---|---|---|---|---|
| 2015/0042318 | A1* | 2/2015 | Youm | G01R 35/00 324/202 |
| 2015/0260804 | A1* | 9/2015 | Kishi | G01R 33/1207 324/210 |
| 2019/0066820 | A1* | 2/2019 | Wang | G11C 11/161 |
| 2019/0195944 | A1* | 6/2019 | Yam | G11C 11/16 |

OTHER PUBLICATIONS

Teradyne. "J750 Test System: Test Solution for Low Cost, High Efficiency Parallel Test ." The date of publication is unknown. Retrieved online on Jun. 27, 2018 from https://www.teradyne.com/products/test-solutions/semiconductor-test/j750.

* cited by examiner

SEMICONDUCTOR WAFER TESTING SYSTEM AND RELATED METHOD FOR IMPROVING EXTERNAL MAGNETIC FIELD WAFER TESTING

REFERENCE TO RELATED APPLICATION

This Application claims the benefit of U.S. Provisional Application No. 62/735,271, filed on Sep. 24, 2018, the contents of which are hereby incorporated by reference in their entirety.

BACKGROUND

Modern day integrated chips comprise millions or billions of semiconductor devices formed on a semiconductor substrate (e.g., silicon substrate). Prior to packaging the semiconductor substrate, the semiconductor devices on the substrate are tested for functional defects and/or performance characteristics. For example, a wafer acceptance test (WAT) is an electrical test in which a wafer prober sends electrical test signals to the semiconductor devices. The electrical test signals check the functionality of the semiconductor devices and identify devices that fail to meet design specifications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
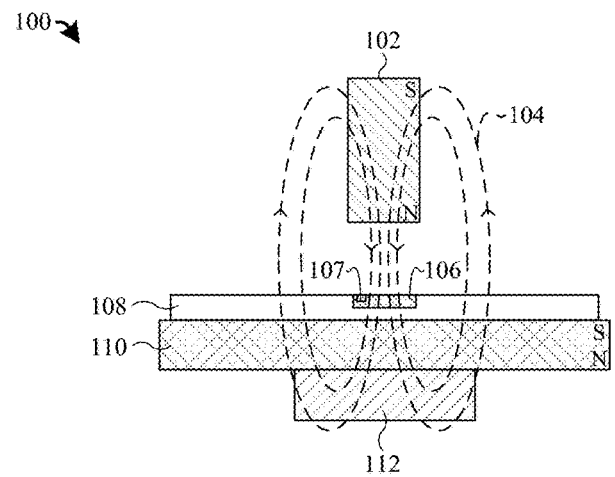
FIG. 1 illustrates a cross-sectional view of some embodiments of a semiconductor wafer testing system comprising an upper magnet disposed over a ferromagnetic wafer chuck.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) are disposed on a semiconductor wafer and comprise a magnetoresistive random-access memory (MRAM) device. The MRAM device comprises a magnetic tunnel junction (MTJ) configured to store data based on a magnetic orientation of the MTJ. For example, the MTJ may have a low resistance state (e.g., a parallel orientation between a pinned layer and a free layer) associated with a first data state (e.g., binary "0") or a high resistance state (e.g., an anti-parallel orientation between the pinned layer and the free layer) associated with a second data state (e.g., binary "1"). Due to the MTJ storing data based on the magnetic orientation of the MTJ, the MTJ is susceptible to inadvertent data state switching (e.g., switching from the first data state to the second data state, or vice versa) when operated in the presence of an external magnetic field (e.g., external to the MRAM device).

Semiconductor wafer testing is typically performed on the above IC to detect functional defects in the presence of an external magnetic field and/or define performance characteristics of the MTJ in the presence of an external magnetic field (e.g., read/write functionality, magnetic immunity, etc.). To test the IC in the presence of an external magnetic field, some semiconductor wafer testing systems utilize a single magnet disposed over a non-ferromagnetic wafer chuck (e.g., aluminum). The non-ferromagnetic wafer chuck holds the semiconductor wafer in place while a wafer prober places one or more conductive probes on the IC, such that the wafer prober may send electrical test signals to the IC to detect functional defects and/or define performance characteristics of the MTJ. The single magnet configuration may generate a first magnetic field that passes through the IC with a first maximum magnetic field strength (e.g., less than about 0.01 tesla).

One challenge with the above semiconductor wafer testing systems is that the first maximum magnetic field strength is not strong enough to simulate some real-world applications. For example, as the use of MRAM devices becomes more prevalent in the semiconductor industry, MRAM devices are being utilized in high magnetic field applications (e.g., automotive applications, biomedical imaging applications, etc.). These high magnetic field applications may expose the MRAM devices to external magnetic fields having magnetic field strengths that are greater than the first magnetic field strength. Thus, because the semiconductor wafer testing system may not generate an external magnetic field with a strong enough magnetic field strength to simulate some real-world applications, the semiconductor wafer testing system may not detect some functional defects that are present above the first maximum magnetic field strength and/or may not define some performance characteristics above the first maximum magnetic field strength. Accordingly, adoption of the above IC in high magnetic field applications may be hindered due to the semiconductor wafer testing system not defining some performance characteristics of the MTJ above the first maximum magnetic field strength or detecting some functional defects present in the IC above the first maximum magnetic field strength.

In various embodiments, the present application is directed toward a semiconductor wafer testing system having an upper magnet disposed over a ferromagnetic wafer chuck. The semiconductor wafer system generates an external magnetic field between the upper magnet and the ferromagnetic wafer chuck. The ferromagnetic wafer chuck amplifies the external magnetic field, such that the external magnetic field passes through an IC with an amplified magnetic field strength (e.g., greater than about 0.01 tesla). Because the ferromagnetic wafer chuck amplifies the magnetic field strength, the semiconductor wafer testing system of the present application may detect some functional defects in the IC that are present above the first maximum magnetic field strength and/or may define some performance characteristics above the first maximum magnetic field strength for an MRAM device disposed on the IC. Accordingly, the semiconductor wafer testing system of the present application may increase adoption of ICs comprising an MRAM device in high magnetic field applications due to defining some performance characteristics of the MRAM device above the first maximum magnetic field strength and/or detecting some functional defects present in the IC above the first maximum magnetic field strength.

FIG. 1 illustrates a cross-sectional view of some embodiments of a semiconductor wafer testing system 100 comprising an upper magnet disposed over a ferromagnetic wafer chuck.

As shown in FIG. 1, the semiconductor wafer testing system 100 comprises an upper magnet 102. The upper magnet 102 is configured to generate an external magnetic field 104 that passes through an integrated chip (IC) 106 disposed on a semiconductor wafer 108. The semiconductor wafer 108 may comprise any type of semiconductor body (e.g., monocrystalline silicon/CMOS bulk, silicon-germanium (SiGe), silicon on insulator (SOI), etc.). In some embodiments, the upper magnet 102 is an electromagnet. In such embodiments, the upper magnet 102 may comprise a conductive wire wound into a coil. In further embodiments, the coil of conductive wire may be wrapped around a core comprising a ferromagnetic material (e.g., iron, nickel, cobalt, etc.). In yet further embodiments, the upper magnet 102 comprises a first magnetic pole (e.g., north (N) magnetic pole) disposed near a first end of the upper magnet 102 and a second magnetic pole (e.g., south (S) magnetic pole) disposed near a second end of the upper magnet 102 opposite the first end. In further embodiments, the IC 106 comprises a magnetoresistive random-access memory (MRAM) device 107. The MRAM device 107 comprises a magnetic tunnel junction (MTJ) configured to store data based on a magnetic orientation (e.g., parallel or anti-parallel) of the MTJ.

A ferromagnetic wafer chuck 110 is disposed directly beneath the upper magnet 102. In some embodiments, the ferromagnetic wafer chuck 110 is a temporary magnet (e.g., magnetized when disposed in an external magnetic field, but loses magnetism once removed from the external magnetic field). The ferromagnetic wafer chuck 110 is configured to amplify the external magnetic field 104, such that the external magnetic field 104 passes through the IC 106 with an amplified magnetic field strength (e.g., between about 0.01 tesla and about 1 tesla). In some embodiments, the amplified magnetic field strength is greater than a maximum magnetic field strength that the upper magnet 102 may generate on its own, which may be referred to as the upper magnet 102 maximum magnetic field strength.

In some embodiments, the ferromagnetic wafer chuck 110 comprises the first magnetic pole (e.g., north (N) magnetic pole) disposed near a first end of the ferromagnetic wafer chuck 110 and the second magnetic pole (e.g., south (S) magnetic pole) disposed near a second end of the ferromagnetic wafer chuck 110 opposite the first end. In such embodiments, the second magnetic pole of the ferromagnetic wafer chuck 110 may face the first magnetic pole of the upper magnet 102. In further embodiments, the ferromagnetic wafer chuck 110 comprises one or more ferromagnetic materials (e.g., iron, nickel, cobalt, etc.). In further embodiments, a composition of the ferromagnetic wafer chuck 110 comprises about 99.9% of the one or more ferromagnetic materials. In yet further embodiments, the ferromagnetic wafer chuck 110 is disposed on a wafer chuck pedestal 112 that provides structural support for the ferromagnetic wafer chuck 110.

Further, the ferromagnetic wafer chuck 110 is configured to hold (e.g., via vacuum, electrostatic forces, etc.) the semiconductor wafer 108 in place while electrical tests are performed on the IC 106. In some embodiments, the electrical tests performed on the IC 106 may, for example, test read functionality of the MRAM device 107 in the presence of the external magnetic field 104, test write functionality (e.g., parallel to anti-parallel write, and vice versa) of the MRAM device 107 in the presence of the external magnetic field 104, test magnetic immunity of the MRAM device 107, define performance characteristics (e.g., safe external magnetic field operating conditions, temperature related safe magnetic field strength operating conditions, etc.) of the IC 106, or the like.

Because the ferromagnetic wafer chuck 110 amplifies the external magnetic field 104 to have the amplified magnetic field strength, the semiconductor wafer testing system 100 may perform electrical tests on the IC 106 that utilize the amplified magnetic field strength. Thus, the electrical tests performed on the IC 106 may detect functional defects present in the IC 106 above the upper magnet 102 maximum magnetic field strength and/or define performance characteristics for the IC above the upper magnet 102 maximum magnetic field strength. More specifically, the electrical tests performed on the IC 106 may detect functional defects present in the MRAM device 107 (and/or the MTJ) above the upper magnet 102 maximum magnetic field strength and/or define performance characteristics for the MRAM device 107 (and/or the MTJ) above the upper magnet 102 maximum magnetic field strength. Accordingly, the semiconductor wafer testing system 100 may increase adoption of the IC 106 in high magnetic field applications due to defining some performance characteristics of the MRAM device 107 (and/or MTJ) above the upper magnet 102 maximum magnetic field strength and/or detecting some functional defects present in the IC 106 above the first maximum magnetic field strength.

Figure 2:
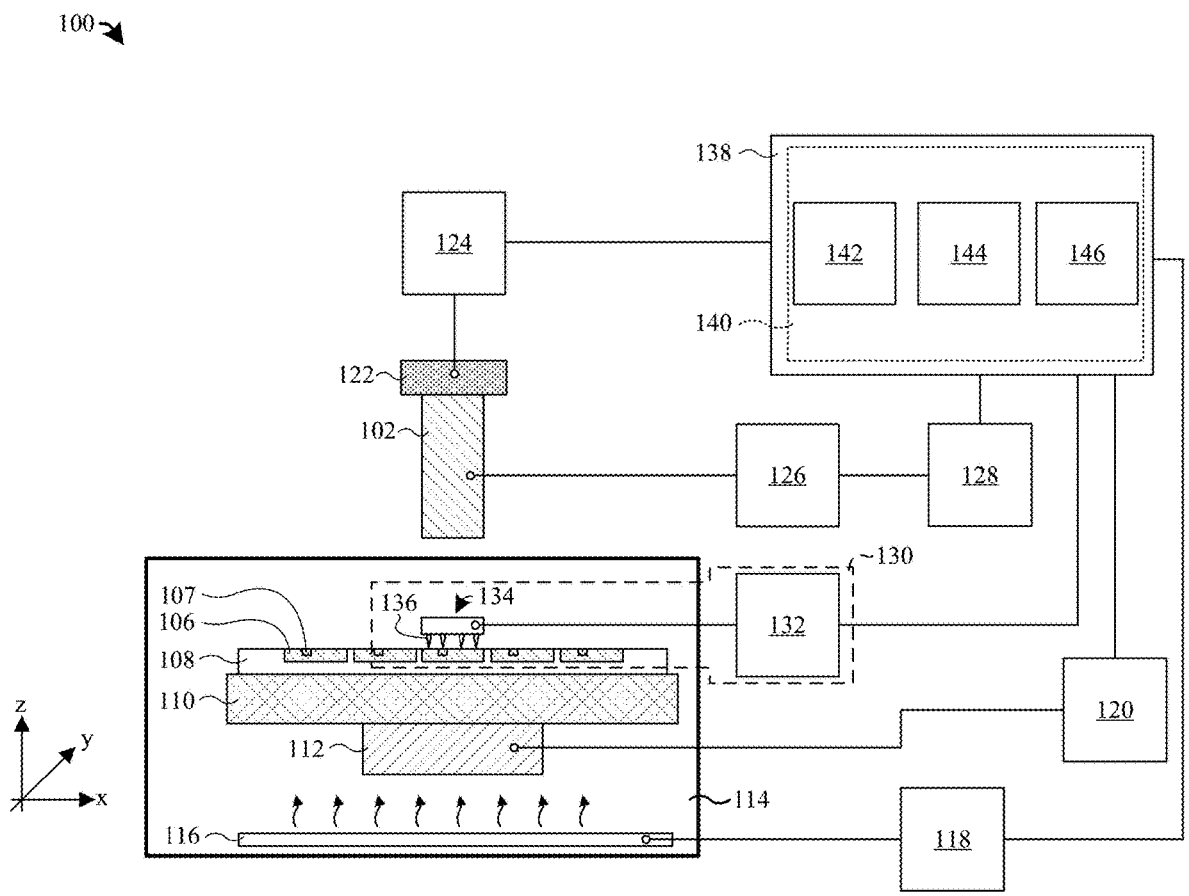
FIG. 2 illustrates some more detailed embodiments of the semiconductor wafer testing system of FIG. 1.

FIG. 2 illustrates some more detailed embodiments of the semiconductor wafer testing system 100 of FIG. 1.

As shown in FIG. 2, the wafer chuck pedestal 112 and the ferromagnetic wafer chuck 110 are disposed in a wafer probing housing 114. The ferromagnetic wafer chuck 110 is configured to hold the semiconductor wafer 108, which may comprises a plurality of ICs 106 each having an MRAM device 107, in the wafer probing housing 114. Further, the upper magnet 102 is disposed outside the wafer probing housing 114 and directly over the ferromagnetic wafer chuck 110. In some embodiments, the upper magnet 102 may be spaced from the ferromagnetic wafer chuck 110 by less than about 1 centimeter.

A wafer heating element 116 is disposed in the wafer probing housing 114. In some embodiments, the wafer heating element 116 is coupled to a temperature management controller 118. The temperature management controller 118 is configured to provide temperature control electrical signals to the wafer heating element 116, such that the wafer heater element 116 may heat the semiconductor wafer 108. In some embodiments, the wafer heating element 116 may heat the semiconductor wafer 108 up to about 150° C. In further embodiments, a wafer cooling element (not shown) may be coupled to the temperature management controller 118 and may cool the semiconductor wafer to about 0° C. In yet further embodiments, the ferromagnetic wafer chuck 110 may comprise the wafer heating element 116 and/or the wafer cooling element (not shown).

In some embodiments, a wafer chuck positioning controller 120 is coupled to the wafer chuck pedestal 112. The wafer chuck positioning controller 120 is configured to provide wafer positioning electrical signals to the wafer chuck pedestal 112, such that the wafer chuck pedestal 112 may position the ferromagnetic wafer chuck 110 at various wafer positions throughout the wafer probing housing 114. In some embodiments, a robotic wafer chuck positioning system (not shown) may be coupled to the wafer chuck pedestal 112 and configured to physically move the ferromagnetic wafer chuck 110 (or the wafer chuck pedestal 112) to the various wafer positions throughout the wafer probing housing 114. In further embodiments, the various wafer positions may be disposed in a 2-D plane (e.g., having an x-axis coordinate and a y-axis coordinate). In yet further embodiments, the various wafer positions may be disposed in a 3-D plane (e.g., having an x-axis coordinate, a y-axis coordinate, and a z-axis coordinate).

In some embodiments, the upper magnet 102 is coupled to an upper magnet support structure 122. The upper magnet support structure 122 provides structural support to mount the upper magnet 102 over the ferromagnetic wafer chuck 110. In some embodiments, the upper magnet support structure 122 may comprise, for example, a metal (e.g. steel), a polymer (e.g., plastic), or the like. In further embodiments, the upper magnet support structure 122 may be coupled to an upper magnet positioning controller 124 configured to provide upper magnet positioning electrical signals to the upper magnet support structure 122. In some embodiments, a robotic upper magnet positioning system (not shown) may be coupled to the upper magnet positioning controller 124 and configured to physically move the upper magnet 102 (or the upper magnet support structure 122) to various upper magnet positions over the ferromagnetic wafer chuck 110. In further embodiments, the various upper magnet positions may be disposed in a 1-D plane (e.g., having a z-axis coordinate). In further embodiments, the various upper magnet positions may be disposed in a 3-D plane (e.g., having an x-axis coordinate, a y-axis coordinate, and a z-axis coordinate). In yet further embodiments, the various upper magnet positions may correspond to positions directly over the ICs 106 disposed on the semiconductor wafer 108.

An upper magnet power supply 126 is coupled to the upper magnet 102 and a power supply controller 128. In some embodiments, the power supply controller 128 is configured to provide a plurality of external magnetic field strength signals to the upper magnet power supply 126. In some embodiments, the upper magnet power supply 126 is configured to provide a plurality of external magnetic field currents to the upper magnet 102 based on the plurality of external magnetic field strength signals. Each external magnetic field current has a magnitude that correspond to an individual external magnetic field signal. Further, each external magnetic field current has a polarity that corresponds to a direction in which the external magnetic field current passes through the upper magnet 102. The upper magnet 102 is configured to receive the external magnetic field currents and generate a plurality of external magnetic fields 104 each having an initial magnetic field strength that corresponds to the magnitude of the external magnetic field currents, and a magnetic field direction that corresponds to the polarity of the external magnetic field currents. The ferromagnetic wafer chuck 110 amplifies the external magnetic fields 104, such that the external magnetic fields 104 each pass through the IC 106 in their respective magnetic field direction with an amplified magnetic field strength that is greater than their respective initial magnetic field strength.

Further, the semiconductor wafer testing system 100 comprises a semiconductor wafer prober 130. In some embodiments, the semiconductor wafer prober 130 comprises a wafer prober controller 132 coupled to a probing structure 134 (e.g., probe card). The probing structure 134 comprises a plurality of conductive probes 136 configured to make electrical connections to the IC 106 (e.g., via contact pads). In some embodiments, the wafer prober controller 132 is configured to provide prober positioning electrical signals to the probing structure 134, such that the conductive probes 136 may be selectively positioned on the IC 106. In further embodiments, the ferromagnetic wafer chuck 110 holds the semiconductor wafer 108 in place while the conductive probes 136 are positioned on the IC 106. In yet further embodiments, a robotic probing structure positioning system (not shown) may be coupled to the wafer prober controller 132 and configured to physically position the probing structure 134 on the IC 106.

Moreover, the semiconductor wafer testing system 100 comprises a tester system 138. In some embodiments, the tester system 138 comprises tester circuitry 140 configured to provide and receive electrical signals to the upper magnet positioning controller 124, the upper magnet support structure 122, the upper magnet 102, the upper magnet power supply 126, the power supply controller 128, the semiconductor wafer prober 130, the wafer chuck positioning controller 120, the wafer chuck pedestal 112, the temperature management controller 118, the wafer heating element 116, or any combination of the foregoing. In further embodiments, the tester circuitry 140 may comprise bias circuitry 142, measurement circuitry 144, analysis circuitry 146, or any combination of the foregoing. In yet further embodiments, the bias circuitry 142, the measurement circuitry 144, and the analysis circuitry 146 may be electrically coupled together.

In some embodiments, the bias circuitry 142 is configured to provide electrical signals to the upper magnet positioning controller 124, the upper magnet support structure 122, the upper magnet 102, the upper magnet power supply 126, the power supply controller 128, the semiconductor wafer prober 130, the wafer chuck positioning controller 120, the wafer chuck pedestal 112, the temperature management controller 118, the wafer heating element 116, or any combination of the foregoing. In further embodiments, the bias circuitry 142 is configured to provide IC testing signals to the IC 106 via the wafer prober controller 132 and the probing structure 134 to probe electrical properties of the IC 106 (e.g., a resistive state of the MTJ). In further embodiments, the bias circuitry 142 is configured to provide a write current to the IC 106 via the wafer prober controller 132 and the probing structure 134 to set a resistive state (e.g., a low resistance state or high resistance state) of the MTJ. In further embodiments, the bias circuitry 142 is configured to provide the wafer positioning electrical signals to the wafer chuck pedestal 112 via the wafer chuck positioning controller 120. In further embodiments, the bias circuitry 142 is configured to provide the temperature control electrical signals to the wafer heating element 116 via the temperature management controller 118. In yet further embodiments, the bias circuitry 142 is configured to provide the upper magnet positioning electrical signals to the upper magnet support structure 122 via the upper magnet support structure 122.

In some embodiments, the bias circuitry 142 is configured to provide electrical signals to the upper magnet 102 via the power supply controller 128 and the upper magnet power supply 126, such that the upper magnet 102 generates the external magnetic field 104. For example, the bias circuitry 142 may provide external magnetic field test signals to the power supply controller 128. Based on the external magnetic field test signals, the power supply controller 128 may provide corresponding external magnetic field strength signals to the upper magnet power supply 126. Based on the external field strength signals (e.g., magnitude, polarity, etc.), the upper magnet power supply 126 may provide corresponding external magnetic field currents to the upper magnet 102, such that the upper magnet 102 generates external magnetic fields 104 based on the external magnetic field currents.

In some embodiments, the measurement circuitry 144 is configured to receive electrical signals from the upper magnet positioning controller 124, the upper magnet support structure 122, the upper magnet 102, the upper magnet power supply 126, the power supply controller 128, the semiconductor wafer prober 130, the wafer prober controller 132, the wafer chuck positioning controller 120, the wafer chuck pedestal 112, the temperature management controller 118, the wafer heating element 116, or any combination of the foregoing. In further embodiments, the measurement circuitry 144 is configured to receive IC output signals via the wafer prober controller 132 and the probing structure 134 that correspond to the electrical properties of the IC 106 (e.g., the resistive state of the MTJ). In further embodiments, the measurement circuitry 144 is configured to provide the IC output signals to the analysis circuitry 146. In yet further embodiments, the analysis circuitry 146 is configured to compare each of the IC output signals to an IC output threshold signal to determine the electrical properties of the IC 106 (e.g., the resistive state of the MTJ).

In some embodiments, the controllers (e.g., the upper magnet positioning controller 124, the power supply controller 128, the wafer chuck positioning controller 120, the temperature management controller 118, and/or the wafer prober controller 132) and/or the circuitry (e.g., the tester circuitry 140, the bias circuitry 142, the measurement circuitry 144, and/or the analysis circuitry 146) of the semiconductor wafer testing system 100 may manifest as an application specific circuit (ASIC) with transistors, semiconductor memory, and/or other semiconductor devices disposed on a semiconductor substrate and electrically coupled to one another to achieve their desired functionalities. In other embodiments, the controllers and/or the circuitry of the semiconductor wafer testing system 100 may manifest as a field programmable gate array (FPGA) that has been programmed to achieve their desired functionalities. In still other embodiments the controllers and/or the circuitry of the semiconductor wafer testing system 100 may manifest as a micro-processor coupled to semiconductor memory, with software modules executing on the micro-processor to carry out their desired functionalities. Thus, the controllers and/or the circuitry of the semiconductor wafer testing system 100 may consist of dedicated hardware in some implementations, and in other implementations may correspond to a combination of hardware and software to achieve their desired functionalities.

Figure 3:
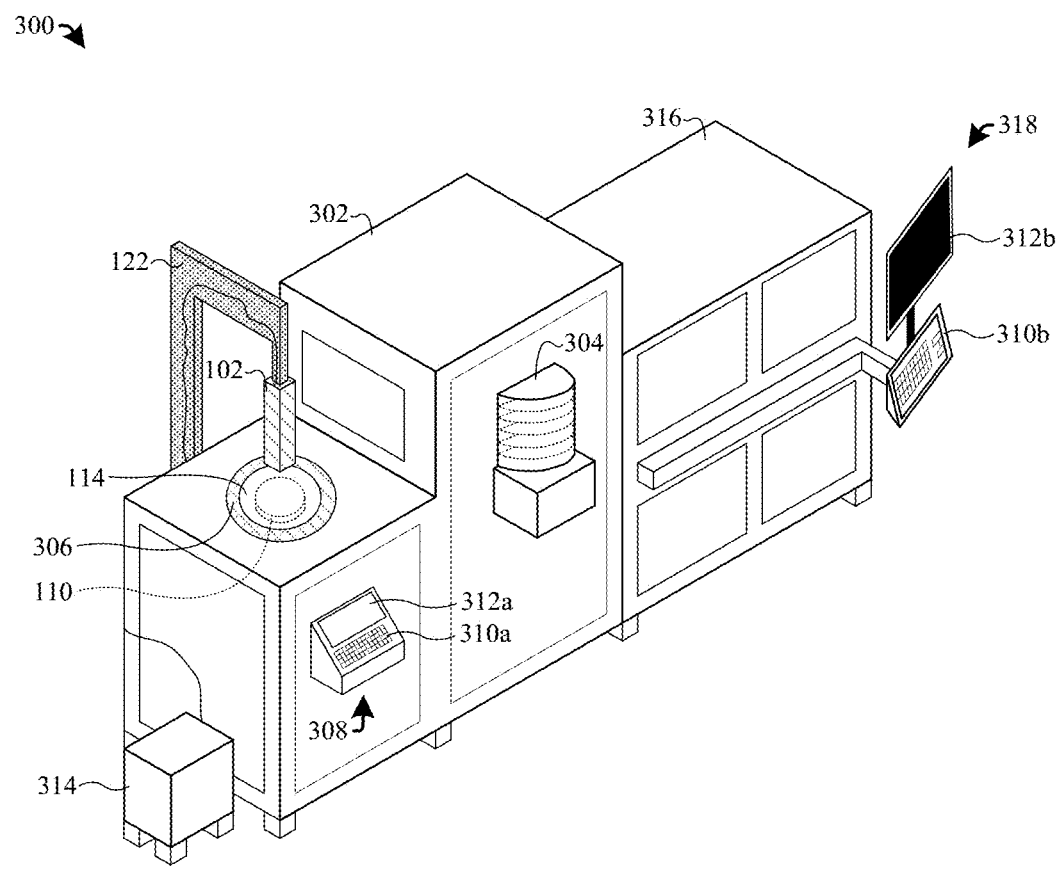
FIG. 3 illustrates a perspective view of some embodiments of an automated semiconductor wafer testing unit comprising some embodiments of the semiconductor wafer testing system of FIG. 2.

FIG. 3 illustrates a perspective view of some embodiments of an automated semiconductor wafer testing unit 300 comprising some embodiments of the semiconductor wafer testing system of FIG. 2.

As shown in FIG. 3, the automated semiconductor wafer testing unit 300 comprises an automated wafer probing unit 302. In some embodiments, the automated wafer probing unit 302 comprises a housing made of metal (e.g., steel, aluminum, etc.). In further embodiments, the automated wafer probing unit 302 comprises the wafer probing housing 114, the ferromagnetic wafer chuck 110, the wafer chuck pedestal 112 (see, e.g., FIG. 2), the semiconductor wafer prober 130 (see, e.g., FIG. 2), the wafer heating element 116 (see, e.g., FIG. 2), the temperature management controller 118 (see, e.g., FIG. 2), the wafer chuck positioning controller 120 (see, e.g., FIG. 2), or any combination of the foregoing. In further embodiments, the automated wafer probing unit 302 is configured to receive a wafer carrier 304 (e.g., a wafer cassette carrier) and automatically remove a semiconductor wafer 108 from the wafer carrier 304 and place the semiconductor wafer 108 (see, e.g., FIG. 2) on the ferromagnetic wafer chuck 110. In further embodiments, the wafer probing housing 114 is drum shaped and extends into the housing of the automated wafer probing unit 302. In yet further embodiments, an upper wafer probing housing (not shown) may be disposed over a top of the wafer probing housing 114.

In some embodiments, the automated wafer probing unit 302 comprises a mounting ring 306 that is disposed around the wafer probing housing 114. The mounting ring 306 is configured to provide mounting points for a variety of semiconductor testing tools (e.g., probe holders). In further embodiments, the upper magnet support structure 122 may be mounted to the mounting ring 306. In yet further embodiments, the automated wafer probing unit 302 comprises an automated wafer probing interface 308 that allows a user to run diagnostics on the automated wafer probing unit 302, change operating routines of the automated wafer probing unit 302, and/or monitor results of previous operations, current operations, or future operations performed by the automated wafer probing unit 302. In such embodiments, the automated wafer probing interface 308 may comprise a first data user input element 310a, such as a keyboard, mouse, touchscreen, and a first data user display element 312a, such as a monitor or some other visual and/or audio output device.

In some embodiments, the automated semiconductor wafer testing unit 300 comprises an upper magnet power supply housing unit 314. In some embodiments, the upper magnet power supply housing unit 314 comprises a housing made of metal (e.g., steel, aluminum, etc.). In further embodiments, the upper magnet power supply housing unit 314 comprises the upper magnet power supply 126 (see, e.g., FIG. 2) and the power supply controller 128 (see, e.g., FIG. 2). In further embodiments, upper magnet power supply housing unit 314 is electrically coupled to the upper magnet 102. In yet further embodiments, the upper magnet power supply housing unit 314 is electrically coupled to the automated wafer probing unit 302 via various data cable/connectors, such that the automated wafer probing unit 302 and the upper magnet power supply housing unit 314 may provide electrical signals to one another.

In some embodiments, the automated semiconductor wafer testing unit 300 comprises a semiconductor tester unit 316. In some embodiments, the semiconductor tester unit 316 comprises a housing made of metal (e.g., steel, aluminum, etc.). In further embodiments, the semiconductor tester unit 316 comprises the tester system 138 (see, e.g., FIG. 2). In further embodiments, the semiconductor tester unit 316 is electrically coupled to the automated wafer probing unit 302 and the upper magnet power supply housing unit 314 via various data cable/connectors, such that the semiconductor tester unit 316, the automated wafer probing unit 302, and the upper magnet power supply housing unit 314 may provide electrical signals to one another. In yet further embodiments, the semiconductor tester unit 316 comprises a semiconductor tester unit interface 318 that allows a user to run diagnostics on the semiconductor tester unit 316, change operating routines of the semiconductor tester unit 316, and/or monitor results of previous operations, current operations, or future operations performed by the semiconductor tester unit 316. In such embodiments, the semiconductor tester unit interface 318 may comprise a second data user input element 310b, such as a keyboard, mouse, touchscreen, and a first data user display element 312b, such as a monitor or some other visual and/or audio output device.

Figure 4:
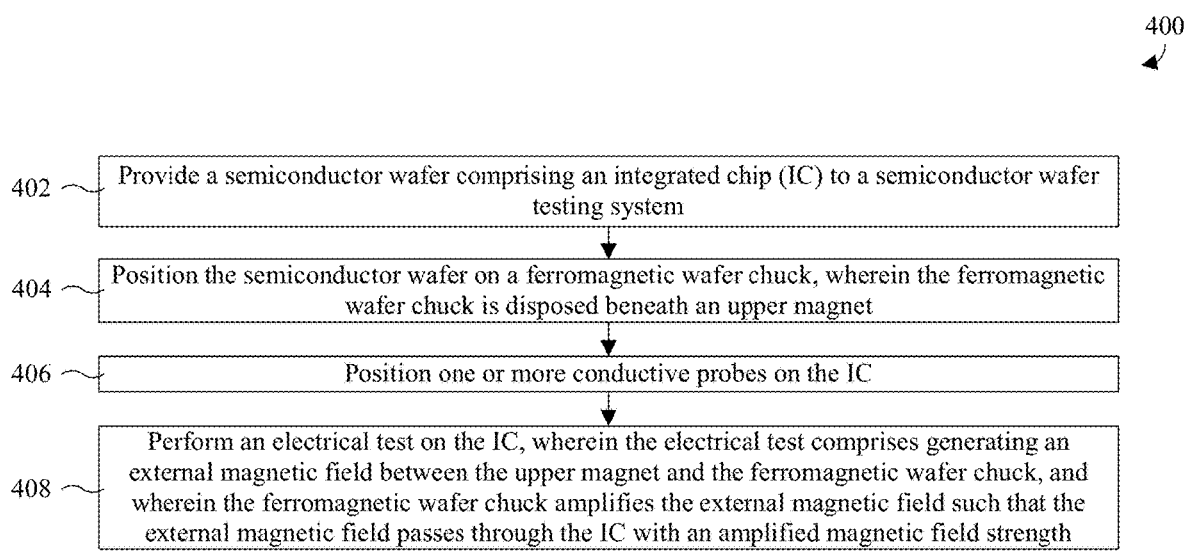
FIG. 4 illustrates a flowchart of some embodiments of a method for testing an integrated chip disposed on a semiconductor wafer with the semiconductor wafer testing system of FIG. 2.

As illustrated in FIG. 4, a flowchart 400 of some embodiments of a method for testing an integrated chip disposed on a semiconductor wafer with the semiconductor wafer testing system of FIG. 2 is provided. While the flowchart 400 of FIG. 4 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 402, a semiconductor wafer comprising an integrated chip (IC) is provided to a semiconductor wafer testing system. For example, with reference to FIG. 2, a semiconductor wafer 108 comprising an IC 106 is provided to the semiconductor wafer testing system 100. In some embodiments, the semiconductor wafer 108 may be provided to the semiconductor wafer testing system 100 via an automated wafer handling system, or a user may manually provide the semiconductor wafer 108 to the semiconductor wafer testing system 100.

At 404, the semiconductor wafer is positioned on a ferromagnetic wafer chuck, wherein the ferromagnetic wafer chuck is disposed beneath an upper magnet. For example, with reference to FIG. 2, the semiconductor wafer 108 is positioned on the ferromagnetic wafer chuck 110, where an upper magnet 102 is disposed over the ferromagnetic wafer chuck 110. In some embodiments, the semiconductor wafer 108 may be positioned on the ferromagnetic wafer chuck 110 by a robotic semiconductor wafer positioning system that removes the semiconductor wafer 108 from a wafer carrier and positions the semiconductor wafer 108 on the ferromagnetic wafer chuck 110.

At 406, one or more conductive probes are positioned on the IC. For example, with reference to FIG. 2, a plurality of conductive probes 136 may be selectively positioned on the IC 106. In some embodiments, a process for positioning the one or more conductive probes on the IC 106 comprises providing prober positioning electrical signals to a wafer prober controller 132 via tester circuitry 140 (e.g., via bias circuitry 142). The wafer prober controller 132 is configured to receive the prober positioning electrical signals and selectively position a probing structure 134 comprising the conductive probes 136 onto the IC 106. In some embodiments, a robotic probing structure positioning system may be coupled to the wafer prober controller 132 and configured to physically position the probing structure 134 on the IC 106.

In some embodiments, the semiconductor wafer 108 may comprises a plurality of ICs 106. In such embodiments, the probing structure 134 may be successively positioned on each of the plurality of ICs 106, such that electrical tests may be performed on each of the plurality of ICs 106. In further embodiments, the robotic probing structure positioning system may physically move the probing structure 134 between each of the plurality of ICs 106 to successively position the probing structure 134 on the plurality of ICs 106. In yet further embodiments, the probing structure 134 may be in a fixed position above the semiconductor wafer 108, and the robotic semiconductor wafer positioning system may physically move the ferromagnetic wafer chuck 110 (or the wafer chuck pedestal 112) to successively position the probing structure 134 on the plurality of ICs 106.

At 408, an electrical test is performed on the IC, wherein the electrical test comprises generating an external magnetic field between the upper magnet and the ferromagnetic wafer chuck, and wherein the ferromagnetic wafer chuck amplifies the external magnetic field such that the external magnetic field passes through the IC with an amplified magnetic field strength. In some embodiments, a plurality of electrical tests may be performed on the IC.

For example, with reference to FIG. 2, a first electrical test may be performed on the IC 106. In some embodiments, the first electrical test is configured to test an MRAM device 107 having an MTJ disposed on the IC 106 to determine performance characteristics of the IC 106, such as safe external magnetic field operating conditions, temperature related safe magnetic field strength operating conditions, or the like. In further embodiments, the safe external magnetic field operating conditions may establish a range of external magnetic field strengths (e.g., between a maximum external magnetic field strength and a minimum magnetic field strength) that may pass through the IC 106 in which the MTJ will maintain a set resistive state (e.g., a low resistance state or a high resistance state). In yet further embodiments, the temperature related safe magnetic field strength operating conditions may establish a range of temperature related external magnetic field strengths (e.g., between a temperature related maximum external magnetic field strength and a minimum temperature related magnetic field strength) that may pass through the IC 106 at a plurality of predetermined temperatures (e.g., between about 0° C. and about 150° C.), where the MTJ will maintain a set resistive state within the range of temperature related external magnetic field strengths.

In some embodiments, a process for performing the first electrical test comprises providing a write current to the IC 106 via a semiconductor wafer prober 130 and the tester circuitry 140 to set the set resistive state of the MTJ (e.g., a high resistance state). After the resistive state of the MTJ is set, an external magnetic field 104 is generated between the upper magnet 102 and the ferromagnetic wafer chuck 110, where the ferromagnetic wafer chuck 110 amplifies the external magnetic field 104 such that the external magnetic field 104 passes through the IC 106 with an amplified magnetic field strength. In further embodiments, the external magnetic field 104 may pass through the IC 106 with the conductive probes 136 positioned on the IC 106. In further embodiments, the amplified magnetic field strength is greater than 0.1 tesla. In yet further embodiments, the IC 106 may be heated via a wafer heating element 116 (or cooled via a wafer cooling element) to predefined testing temperatures (e.g., between about 0° C. and about 150° C.) at various stages throughout the electrical tests.

In some embodiments, a process for generating the external magnetic field 104 comprises providing external magnetic field test signals to a power supply controller 128. Based on the external magnetic field test signals, the power supply controller 128 provides corresponding external magnetic field strength signals to the upper magnet power supply 126. Based on the external field strength signals (e.g., magnitude, polarity, etc.), the upper magnet power supply 126 may provide corresponding external magnetic field currents to the upper magnet 102, such that the upper magnet 102 generates the external magnetic field 104. Once the external magnetic field 104 is generated, the external magnetic field is amplified by the ferromagnetic wafer chuck 110, such that the external magnetic field 104 passes through the IC 106 with an amplified magnetic field strength. In some embodiments, the amplified magnetic field strength is greater than a maximum magnetic field strength that the upper magnet 102 may generate on its own, which may be referred to as the upper magnet 102 maximum magnetic field strength. In further embodiments, the corresponding external magnetic field currents may be provided to the upper magnet 102 successively with differing magnitude to change the magnetic field strength of the external magnetic field 104 and/or differing polarity to pass the external magnetic field 104 through the IC in a first direction or a second direction opposite the first direction. In yet further embodiments, the process for generating the external magnetic field 104 may comprise a magnetic field strength sweep that includes increasing the external magnetic field strength of the external magnetic field 104 at predefined intervals from a lower magnetic field strength (e.g., about 0.01 tesla) to an upper magnetic field strength (e.g., about 1 tesla).

After the external magnetic field 104 is generated, the tester circuitry 140 (e.g., the bias circuitry 142) provides IC testing signals to the IC 106 via the wafer prober controller 132 and the probing structure 134 to probe the resistive state of the MTJ. In some embodiments, the IC testing signals are provided to the IC 106 at the predefined intervals. Based on the IC testing signals and the resistive state of the MTJ, the tester circuitry 140 (e.g., measurement circuitry 144) receives IC output signals from the IC 106 via the wafer prober controller 132 and the probing structure 134. In some embodiments, the tester circuitry 140 receives an individual IC output signal at each of the predefined intervals. After the tester circuitry 140 receives the IC output signals, the measurement circuitry 144 provides the IC output signals to analysis circuitry 146. The analysis circuitry 146 compares each of the IC output signals to a threshold IC output signal to determine the resistive state of the MTJ. In some embodiments, the tester circuitry 140 may provide the IC testing signals to the IC 106, receive the IC output signals, and/or compare the IC output signals to the threshold IC output signal while the external magnetic field 104 is passing through the IC 106 and/or after the magnetic field has passed through the IC 106.

In some embodiments, the analysis circuitry 146 compares the IC output signals to determine a maximum magnetic field strength that may pass through the IC without switching the set resistive state of the MTJ from a first resistive state (e.g., a low resistance state) to a second resistive state (e.g., a high resistance state), or vice versa. In further embodiments, the analysis circuitry 146 compares the IC output signals to determine a plurality of temperature related maximum external magnetic field strengths that correspond to a maximum magnetic field strength at a plurality of predefined temperatures that may pass through the IC without switching the set resistive state of the MTJ from the first resistive state to the second resistive state, or vice versa. In such embodiments, as the predefined temperatures increase, the corresponding temperature related maximum external magnetic field strengths may decrease. In yet further embodiments, the analysis circuitry 146 compares the IC output signals to determine if the IC 106 has functional defects (e.g., degrade device performance due to nonfunctional MRAM devices 107). In such embodiments, the IC 106 may be binned out (e.g., categorized and placed into bins based on the performance characteristic of the IC 106) and/or the IC 106 may repair the functional defects by a repair process (e.g., blowing fuses to reroute circuits on the IC 106).

Because the ferromagnetic wafer chuck 110 amplifies the external magnetic field 104 to have the amplified magnetic field strength, the electrical tests performed on the IC 106 may detect functional defects present in the IC 106 above the upper magnet 102 maximum magnetic field strength and/or define the performance characteristics for the IC above the upper magnet 102 maximum magnetic field strength. More specifically, the electrical tests performed on the IC 106 may detect functional defects present in the MRAM device 107 (and/or the MTJ) above the upper magnet 102 maximum magnetic field strength and/or define performance characteristics for the MRAM device 107 (and/or the MTJ) above the upper magnet 102 maximum magnetic field strength. Accordingly, the semiconductor wafer testing system 100 may increase adoption of the IC 106 in high magnetic field applications due to defining some performance characteristics of the MRAM device 107 (and/or MTJ) above the upper magnet 102 maximum magnetic field strength and/or detecting some functional defects present in the IC 106 above the first maximum magnetic field strength.

In some embodiments, a second electrical test may be performed on the IC 106. In some embodiments, the second electrical test is configured to test read functionality of the IC 106 (or the MRAM device 107) in the presence of the external magnetic field 104. In such embodiments, while the external magnetic field 104 passes through the IC 106, the tester circuitry 140 may provide read signals to the MRAM device 107, receive output read signals from the IC 106, and compare the output read signals to a threshold output read signal to determine the read functionality of the MRAM device 107 in the presence of the external magnetic field 104. In further embodiments, the magnetic strength of the external magnetic field 104 may be varied during the second electrical test.

In some embodiments, a third electrical test may be performed on the IC 106. In some embodiments, the third electrical test is configured to test write functionality (e.g., parallel to anti-parallel write, and vice versa) of the IC 106 (or the MRAM device 107) in the presence of the external magnetic field 104. In such embodiments, while the external magnetic field 104 passes through the IC 106, the tester circuitry 140 may provide write signals to the MRAM at various magnetic field strengths. Subsequently, after each of the write signals is provided to the MRAM signal, the tester circuitry may receive read signals and compare the read signals to a threshold read signal to determine the write functionality of the MRAM device 107 in the presence of the external magnetic field 104.

In some embodiments, the present application provides a semiconductor wafer testing system. The semiconductor wafer testing system includes a semiconductor wafer prober having one or more conductive probes, where the semiconductor wafer prober is configured to position the one or more conductive probes on an integrated chip (IC) that is disposed on a semiconductor wafer. Further, the semiconductor wafer testing system includes a ferromagnetic wafer chuck, wherein the ferromagnetic wafer chuck is configured to hold the semiconductor wafer while the wafer prober positions the one or more conductive probes on the IC. An upper magnet is disposed over the ferromagnetic wafer chuck. The upper magnet is configured to generate an external magnetic field between the upper magnet and the ferromagnetic wafer chuck, and the ferromagnetic wafer chuck amplifies the external magnetic field such that the external magnetic field passes through the IC with an amplified magnetic field strength.

In other embodiments, the present application provides a method for testing an integrated chip disposed on a semiconductor wafer. The method includes providing a semiconductor wafer comprising an integrated chip (IC) to a semiconductor wafer testing system. The semiconductor wafer testing system includes an upper magnet disposed over a ferromagnetic wafer chuck, and the semiconductor wafer testing system includes a semiconductor wafer prober having one or more conductive probes. The semiconductor wafer is positioned on the ferromagnetic wafer chuck. The one or more conductive probes are positioned on the IC. An external magnetic field is generated between the upper magnet and the ferromagnetic wafer chuck, where the ferromagnetic wafer chuck amplifies the external magnetic field such that the external magnetic field passes through the IC with an amplified magnetic field strength. An IC testing signal is provided to the IC via the one or more conductive probes. An IC output signal based on the IC testing signal is received via the one or more conductive probes to determine performance characteristics of the IC.

In yet other embodiments, the present application provides a method for testing an integrated chip disposed on a semiconductor wafer. The method includes positioning a semiconductor wafer having an integrated chip (IC) on a ferromagnetic wafer chuck. The IC includes a magnetic tunnel junction (MTJ), and the MTJ is configured to switch between a first resistive state and a second resistive state. A prober positioning electrical signal is provided to a wafer prober controller, where the wafer prober controller positions one or more conductive probes on the IC based on the prober positioning electrical signal. A write current is provided to the IC via the one or more conductive probes to set a resistive state of the MTJ to the first resistive state. While the one or more conductive probes are positioned on the IC, a first magnetic field testing signal is provided to an upper magnet that is disposed directly over the ferromagnetic wafer chuck to generate a first eternal magnetic field between the upper magnet and the ferromagnetic wafer chuck, where the first external magnetic field passes through the IC in a first direction. After the first external magnetic field is generated, a first testing input electrical signal is provided to the IC via the one or more conductive probes to probe the resistive state of the MTJ; a first testing output electrical signal based on the first testing input electrical signal and the resistive state of the MTH is received by tester circuitry; and the first testing output electrical signal is compared to a threshold signal by the tester circuitry to determine if the resistive state of the MTJ is the first resistive state or the second resistive state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor wafer testing system, comprising:
    a semiconductor wafer prober comprising one or more conductive probes, wherein the semiconductor wafer prober is configured to position the one or more conductive probes on an integrated chip (IC) that is disposed on a semiconductor wafer; and
    a ferromagnetic wafer chuck, wherein the ferromagnetic wafer chuck is configured to hold the semiconductor wafer while the semiconductor wafer prober positions the one or more conductive probes on the IC; and
    an upper magnet disposed over the ferromagnetic wafer chuck, wherein the upper magnet is configured to generate an external magnetic field between the upper magnet and the ferromagnetic wafer chuck, and wherein the ferromagnetic wafer chuck amplifies the external magnetic field such that the external magnetic field passes through the IC with an amplified magnetic field strength.

2. The semiconductor wafer testing system of claim 1, wherein the upper magnet is an electromagnet.

3. The semiconductor wafer testing system of claim 1, wherein the ferromagnetic wafer chuck is a temporary magnet.

4. The semiconductor wafer testing system of claim 1, wherein the external magnetic field passes through the IC while the one or more conductive probes are positioned on the IC, and wherein the amplified magnetic field strength is between about 0.01 tesla and about 1 tesla.

5. The semiconductor wafer testing system of claim 1, further comprising:
    a wafer probing housing, wherein the ferromagnetic wafer chuck is disposed in the wafer probing housing, and wherein the upper magnet is disposed over the wafer probing housing.

6. The semiconductor wafer testing system of claim 1, wherein a composition of the ferromagnetic wafer chuck comprises about 99.9% of a ferromagnetic material.

7. The semiconductor wafer testing system of claim 6, wherein the ferromagnetic material is iron, cobalt, or nickel.

8. A method comprising:
    providing a semiconductor wafer comprising an integrated chip (IC) to a semiconductor wafer testing system, wherein the semiconductor wafer testing system comprises an upper magnet disposed over a ferromagnetic wafer chuck, and wherein the semiconductor wafer testing system comprises a semiconductor wafer prober comprising one or more conductive probes;
positioning the semiconductor wafer on the ferromagnetic wafer chuck;
positioning the one or more conductive probes on the IC;
generating an external magnetic field between the upper magnet and the ferromagnetic wafer chuck, wherein the ferromagnetic wafer chuck amplifies the external magnetic field such that the external magnetic field passes through the IC with an amplified magnetic field strength;
providing an IC testing signal to the IC via the one or more conductive probes; and
receiving an IC output signal based on the IC testing signal via the one or more conductive probes to determine performance characteristics of the IC.

9. The method of claim 8, wherein the amplified magnetic field strength is greater than about 0.01 tesla.

10. The method of claim 8, further comprising:
before the external magnetic field is generated, providing a write current to the IC via the one or more conductive probes to set a resistive state of a magnetic tunnel junction (MTJ) to a first resistive state, wherein the MTJ is configured to switch between the first resistive state and a second resistive state different than the first resistive state;
after the external magnetic field is generated, providing the IC testing signal to the MTJ to probe the resistive state of the MTJ; and
comparing the IC output signal to a threshold output signal to determine if the external magnetic field switched the resistive state of the MTJ from the first resistive state to the second resistive state.

11. The method of claim 10, wherein the performance characteristics of the IC comprise a maximum external magnetic field strength, and wherein the resistive state of the MTJ switches from the first resistive state to the second resistive state at or above the maximum external magnetic field strength.

12. The method of claim 11, further comprising:
performing a first instance of a magnetic field strength sweep to determine the maximum external magnetic field strength, wherein the magnetic field strength sweep comprises:
increasing the magnetic field strength of the external magnetic field at predefined intervals from a lower magnetic field strength to an upper magnetic field strength;
providing a series of IC testing signals to the MTJ to probe the resistive state of the MTJ at each of the intervals;
receiving a series of IC output signals corresponding to the IC testing signals; and
comparing each of the IC output signals of the series of IC output signals to the threshold output signal to determine the resistive state of the MTJ at each of the intervals.

13. The method of claim 12, further comprising:
while the first instance of the magnetic field strength sweep is being performed, heating the IC to a first predefined testing temperature;
performing a second instance of the magnetic field strength sweep; and
while the second instance of the magnetic field strength sweep is being performed, heating the IC to a second predefined testing temperature different than the first predefined testing temperature.

14. The method of claim 13, wherein the performance characteristics of the IC comprise:
a first temperature related maximum external magnetic field strength, wherein the resistive state of the MTJ switches from the first resistive state to the second resistive state at or above the first temperature related maximum external magnetic field strength when the IC is at the first predefined testing temperature; and
a second temperature related maximum external magnetic field strength, wherein the resistive state of the MTJ switches from the first resistive state to the second resistive state at or above the second temperature related maximum external magnetic field strength when the IC is at the second predefined testing temperature.

15. The method of claim 14, wherein the lower magnetic field strength is about 0.01 tesla and the upper magnetic field strength is about 1 tesla.

16. The method of claim 15, wherein the first predefined testing temperature and the second predefined testing temperature are between about 0° C. and about 150° C.

17. A method comprising:
positioning a semiconductor wafer comprising an integrated chip (IC) on a ferromagnetic wafer chuck, wherein the IC comprises a magnetic tunnel junction (MTJ), and wherein the MTJ is configured to switch between a first resistive state and a second resistive state;
providing a prober positioning electrical signal to a wafer prober controller, wherein the wafer prober controller positions one or more conductive probes on the IC based on the prober positioning electrical signal;
providing a write current to the IC via the one or more conductive probes to set a resistive state of the MTJ to the first resistive state;
while the one or more conductive probes are positioned on the IC, providing a first magnetic field testing signal to an upper magnet disposed directly over the ferromagnetic wafer chuck to generate a first external magnetic field between the upper magnet and the ferromagnetic wafer chuck, wherein the first external magnetic field passes through the IC in a first direction;
after the first external magnetic field is generated:
providing a first testing input electrical signal to the IC via the one or more conductive probes to probe the resistive state of the MTJ;
receiving a first testing output electrical signal based on the first testing input electrical signal and the resistive state of the MTJ, wherein tester circuitry receives the first testing output electrical signal; and
comparing the first testing output electrical signal to a threshold signal to determine if the resistive state of the MTJ is the first resistive state or the second resistive state, wherein the tester circuitry compares the first testing output electrical signal to the threshold signal.

18. The method of claim 17, wherein generating the first external magnetic field comprises:
providing a first external magnetic field test signal to a power supply controller;
based on the first external magnetic field test signal, providing a first external magnetic field strength signal to a power supply via the power supply controller; and based on the first external magnetic field strength signal, providing a first external magnetic field strength current to the upper magnet to generate the first external magnetic field, wherein the ferromagnetic wafer chuck amplifies a first magnetic field strength of the first external magnetic field such that the first external magnetic field passes through the IC with a first amplified magnetic field strength.

19. The method of claim 18, further comprising:
generating a second external magnetic field that passes through the IC in a second direction opposite the first direction by:
   providing a second external magnetic field test signal to the power supply controller;
   based on the second external magnetic field test signal, providing a second external magnetic field strength signal to the power supply via the power supply controller; and
   based on the second external magnetic field strength signal, providing a second external magnetic field strength current having an opposite electrical polarity as the first external magnetic field strength current to the upper magnet to generate the second external magnetic field, wherein the ferromagnetic wafer chuck amplifies a second magnetic field strength of the second external magnetic field such that the second external magnetic field passes through the IC with a second amplified magnetic field strength;
after the second external magnetic field is generated:
   providing a second testing input electrical signal to the IC via the one or more conductive probes to probe the resistive state of the MTJ;
   receiving a second testing output electrical signal based on the second testing input electrical signal and the resistive state of the MTJ, wherein the tester circuitry receives the second testing output electrical signal; and
   comparing the second testing output electrical signal to the threshold signal to determine if the resistive state of the MTJ is the first resistive state or the second resistive state, wherein the tester circuitry compares the second testing output electrical signal to the threshold signal.

20. The method of claim 19, wherein:
the first testing input electrical signal is provided to the IC while the first external magnetic field is passing through the IC;
the tester circuitry receives the first testing output electrical signal while the first external magnetic field is passing through the IC;
the second testing input electrical signal is provided to the IC while the second external magnetic field is passing through the IC; and
the tester circuitry receives the second testing output electrical signal while the second external magnetic field is passing through the IC.

* * * * *